United States Patent
Goo et al.

(10) Patent No.: US 6,635,586 B2
(45) Date of Patent: Oct. 21, 2003

(54) METHOD OF FORMING A SPIN-ON-GLASS INSULATION LAYER

(75) Inventors: Ju-Seon Goo, Suwon (KR); Eun-Kee Hong, Suwon (KR); Hong-Gun Kim, Suwon (KR); Jin-Gi Hong, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/977,673

(22) Filed: Oct. 15, 2001

(65) Prior Publication Data

US 2002/0072246 A1 Jun. 13, 2002

(30) Foreign Application Priority Data

Dec. 11, 2000 (KR) .......................................... 2000-75179

(51) Int. Cl.[7] .............................................. H01L 2/469
(52) U.S. Cl. ....................... 438/782; 438/760; 438/761; 438/593; 438/622; 438/623; 438/624; 438/626
(58) Field of Search ............................... 438/760, 761, 438/593, 622, 623, 624, 626, 782

(56) References Cited

U.S. PATENT DOCUMENTS 6,074,939 A    6/2000  Wantanabe ................. 438/596
6,197,703 B1 * 3/2001  You et al.
6,432,843 B1 * 8/2002  Kim et al.
2002/0064937 A1 * 5/2002  Kim et al.
2002/0064968 A1 * 5/2002  Kim et al.
2002/0123206 A1 * 9/2002  Hong et al.
2002/0127817 A1 * 9/2002  Heo et al.

FOREIGN PATENT DOCUMENTS

JP        10242139      6/2000     ....... H01L/21/8247

* cited by examiner

Primary Examiner—Long Pham
(74) Attorney, Agent, or Firm—Mills & Onello LLP

(57) ABSTRACT

A method of forming a SOG insulation layer of a semiconductor device comprises forming the SOG insulation layer on a substrate having a stepped pattern by using a polysilazane in a solution state, performing a pre-bake process for removing solvent elements of the insulation layer at a temperature of 50 to 350° C., performing a hard bake process for restraining particles from forming at a temperature of 350 to 500° C., and annealing at a temperature of 600 to 1200° C. The method of the invention further includes planarizing the insulation layer between the hard bake process and the annealing step. Also, the hard bake process can be omitted.

11 Claims, 3 Drawing Sheets

METHOD OF FORMING A SPIN-ON-GLASS INSULATION LAYER

This application relies for priority upon Korean Patent Application No. 2000-75179, filed on Dec. 11, 2000, the contents of which are herein incorporated by reference in their entirety.

FIELD OF THE INVENTION

The present invention relates to a method of forming an insulation layer, and more particularly to a method of forming an insulation layer of a semiconductor device using a spin-on-glass (SOG) layer.

BACKGROUND OF THE INVENTION

As the elements incorporated into a semiconductor device are increasingly integrated, the sizes of the elements is gradually decreasing, and the semiconductor devices are becoming increasingly multi-layered. Thus, in highly integrated semiconductor devices, problems such as increase in the aspect ratio of contact or via holes which penetrate a given region between the interconnect lines or the circuit elements and enlargement of the step coverage are more intensified. That is, as the aspect ratio of the contact holes is increased, it becomes more difficult to form deep and narrow holes in certain layers of the device and to fill the narrow holes with conductive material to interconnect the multiple layers. Also, undesirable step coverage at a lower part of the device results in a problem when an upper part of the device is patterned to form the interconnects (wires) or elements by means of photolithography. To reduce these problems, a technique using an interlayer insulation layer such as a method of filling gaps between the elements such as gate lines with the interlayer insulation layer and planarizing the upper part of the interlayer insulation layer has been developed and used.

As an example of the technique using an interlayer insulation layer, there has been proposed a method of forming a boro-phospho silicate glass (BPSG) layer and then performing a heat treatment process at a high temperature of about 830° C. However, since width between gate lines is designed below a critical dimension (CD) of 0.2 $\mu$m with the semiconductor device highly integrated, the heat treatment at the high temperature for forming the interlayer insulation layer may result in a problem damaging the elements, for example reduced transistors in the semiconductor device.

To solve the problem due to the heat treatment at the high temperature, there has been another method of using an $O_3$ tetra ethyl ortho silicate undoped silicate glass ($O_3$ TEOS USG), or high density plasma enhanced chemical vapor deposition (HDP CVD) oxide layer. However, these layers also present a problem of generating voids or seams when the width between gate lines is designed below a CD of 0.2 $\mu$m, for example about 0.18 $\mu$m.

To solve the problems described above, there has been used another method of using a spin-on glass (SOG) layer as an interlayer insulation layer. SOG materials are advantageous to fill the gaps between the gate lines and to reduce the step coverage since it is first in a state of liquid or sol.

As one of the SOG materials, hydro silsesquioxane (HSQ) material is used. After the HSQ material is applied to a substrate, a soft bake process is carried out at a low temperature of 100 to 300° C. to remove solvent ingredients. Then, a hard bake process is carried out at a temperature of about 400° C. for several, e.g., ten, minutes to harden the formed HSQ layer.

However, even though the HSQ layer is annealed under an oxidative atmosphere through the hard bake process, a curing of forming silicon dioxide-crystallized structures is not accomplished well. Particularly, in case of using the SOG layer to fill deep and narrow gaps of the pattern, it is difficult to make oxygen and elements combined thereto diffuse. Also, since the curing is carried out at relatively low temperature and begins from the surface of the SOG layer to interfere with the diffusion of oxygen, the HSQ layer is not cured very well.

When the curing of the HSQ layer is not accomplished well, impurity ingredients such as hydrogen and the like may not be removed completely and remain in the HSQ layer. The impurity ingredients may result in a problem such as forming a porous crystallized structure in the HSQ layer. When the following etching and cleaning process is carried out to a portion of the SOG layer having the porous crystallized structure, an etch rate at the portion of the SOG layer comes to be faster than that at other portions without the porous crystallized structure therein.

For example, in case the interlayer insulation layer is formed of the HSQ layer after forming a metal oxide silicon (MOS) transistor structure on a substrate, the porous crystallized structure is apt to be formed in a lower part of the interlayer insulation layer between the gate lines. Therefore, when the pads for bit line contacts or storage node contacts are formed by means of a self-aligned method, the lower part of the SOG layer having the porous crystallized structure is exposed. The exposed lower part of the SOG layer is easily etched by means of a very small amount of etchant contained in a detergent such as a mixture of $NH_4OH$, $H_2O_2$ and de-ionized water called SCI, or buffered oxide etcher (BOE). As a result, pipe line shaped bridges can be formed between the adjacent pads through the exposed lower part of the SOG layer. These bridges may cause a short circuit between wires, resulting in abnormal operation of the semiconductor device.

Also, in the portion of the SOG layer having the porous crystallized structure, a difference in the stress or tension may be generated according to the thermal expansion and the like as compared with other portions without the porous crystallized structure, resulting in deterioration of reliability of the elements generation of devices of inferior quality.

Among the SOG materials, the silazane series is material indicated as a structural formula —$(SiR_1R_2NR_3)n$— having average atomic weight of 1000 to 2000. The silazane series usually uses perhydro-polysilazane wherein all of $R_1$, $R_2$, and $R_3$ is hydrogen, or organic polysilazane wherein $R_1$, $R_2$, and $R_3$ are an alkyl radical of 1–8 carbon atoms, an aryl radical, and an alkoxyl radical, respectively. The perhydro-polysilazane or organic polysilazane which is usually called polysilazane is used as a solution melted as much as a given % by weight in a solvent such as dibuthyl ether, toluene, or xylene. The polysilazane can carry out the heat treatment at higher temperature as compared with silicate, or siloxane series, so that more complete curing can be accomplished. Also, the polysilazane has a high resistance to wet etching, so that it is easy to apply to the real process compared with the HSQ layer. Also, when a polysilazane layer is formed to be relatively thick, a plane state of the whole surface of the substrate can be improved enough to carry out subsequent processes such as a chemical-mechanical polishing (CMP) without forming a capping oxide layer on an upper part of the polysilazane layer.

The polysilazane layer is generally formed by performing a bake process for removing solvent ingredients, and an annealing process for curing formed polysilazane layer at a high temperature of more than 600° C., for example 700° C., after the polysilazane is applied to a substrate. An example of a method of baking and annealing the polysilazane layer is disclosed in Japanese Patent Applicant No. 97-044,132 filed by Nippon Denki Co., Ltd.

FIG. 1 is a flow chart showing the process steps of a conventional method of forming a SOG insulation layer of a semiconductor device. The method comprises forming a pattern on a surface of a substrate (10), applying a SOG layer on the surface of the substrate (20), performing a pre-bake process to the substrate (30), performing a high temperature annealing process to the substrate (40), and performing the following or subsequent processes (50).

However, in the method, silane ($SiH_4$) gases which generally begin to discharge from the SOG layer in the vicinity of a temperature of about 400° C. are generated in a large quantity during the high temperature annealing process and are easily combined with other discharged ingredients such as nitrogen and hydrogen, and an atmosphere gas such as oxygen. Consequently, a plurality of particles composed of silicon oxides or silicon nitrides having magnitudes of several hundred angstroms A are formed on the surface of the substrate and/or in the inside of the equipment. These particles may result in particle defects of the corresponding substrate and/or other substrates in the equipment.

Referring to FIG. 2, also, if the particles, for example a particle 21, exists in the substrate before applying the polysilazane, the SOG layer 23 is thickened in the vicinity of the particle 21. After the high temperature annealing, the thickened portion of the SOG layer 23 is strengthened. Also, a difference in the stress is partially generated according to thermal expansion and the like, so that a crack 25 may form in the thickened portion of the SOG layer 23. If the particle or crack occurs in the manufacturing process, the production rate of the semiconductor device will not only be reduced, but also the reliability of the elements will be reduced.

SUMMARY OF THE INVENTION

Therefore, it is an object of the present invention to provide an improved method of forming an insulation layer of a semiconductor device which when a SOG layer of silazane series is used as the insulation layer, can restrain particles from being formed on a surface of a substrate during a high temperature annealing.

It is another object of the present invention to provide an improved method of forming an insulation layer of a semiconductor device which when a SOG layer of silazane series is used as the insulation layer, can prevent cracks from forming due to particles which exist in a substrate before applying the SOG layer.

These and other objects are provided, according to an aspect of the present invention, by a method of forming a SOG insulation layer of a semiconductor device. In accordance with the method, the SOG insulation layer is formed on a substrate having a stepped pattern using a polysilazane in a solution state. A pre-bake process is performed to remove solvent ingredients in the insulation layer at a temperature of 50 to 350° C. A hard bake process is performed to restrain particles from being formed, the hard bake process being performed at a temperature of 350 to 500° C. An annealing process is then performed at a temperature of 600 to 1200° C., preferably 700 to 900° C.

In one embodiment, the pre-bake process comprises increasing a temperature continuously for 2 to 7 minutes. Alternatively, the pre-bake process can comprise heating at temperatures of 75° C., 150° C., and 250° C. for 1 to 5 minutes each. The pre-bake process is carried out in-situ, that is, while the structure remains in place in the process chamber.

In one embodiment, the hard bake process is carried out for 10 to 100 minutes in the vicinity of a temperature of 400° C. which begins to generate silane gases. Preferably, the hard bake process is carried out at a temperature of 400 to 450° C. for 30 to 60 minutes. Also, the hard bake process can be carried out under a vacuum or nitrogen atmosphere as well as an oxidative atmosphere which is abundant in oxygen or watery vapor. That is, in the vacuum or inert gas atmosphere, even though gases are generated from the SOG layer, a chemical reaction forming particles is not activated. In the oxidative atmosphere, since a concentration of the gases generated during the hard bake process is low, particle formation is minimal. Also, in the oxidative atmosphere, a cured film or layer can be formed to prevent gases from generating from the SOG layer. When the process temperature is lower than the above standard or predetermined temperature, both a reaction of generating gases from the SOG layer and a hardening or curing of preventing gases from generating from the SOG layer is not sufficiently accomplished, so that the process time is lengthened and it comes to be difficult to restrain gases from generating during the following annealing process. Also, when the process temperature is higher than the standard temperature, gases are greatly generated from the SOG layer, so that it is possible to make particles to be formed during the hard bake process.

In one embodiment, the annealing step is carried out at a temperature of 600 to 1200° C. for 10 to 120 minutes. Preferably, the annealing step is carried out at a temperature of 700 to 900° C. for 30 to 120 minutes. Since an object of the annealing is curing, the annealing is preferably carried out under an oxidative atmosphere.

Also, the method of the invention further includes planarizing the insulation layer between the hard bake process and the annealing step. The planarizing is performed mainly to thin the SOG layer.

According to another aspect of the present invention, there is provided a method of forming a SOG insulation layer of a semiconductor device. A SOG insulation layer is formed on a substrate having a stepped pattern using a polysilazane. A bake process is performed to remove solvent ingredients in the insulation layer at a temperature of below 500° C. The insulation layer is planarized after the bake process, and the substrate is annealed at a temperature of 600 to 1200° C., preferably 700 to 900° C. after the planarizing step.

In one preferred embodiment, the planarizing step is carried out by means of a CMP. Slurries for the CMP can be basic slurries including at least one selected from the group including silica ($SiO_2$), ceria ($CsO_2$), alumina ($Al_2O_3$) and mangania ($MnO_3$). Alternatively, the planarizing step can be carried out by means of wet-etching or dry-etching.

In one embodiment, the substrate has at least one trench for isolation formed thereon to define at least one active region. The planarizing step can be carried out until the active region is exposed.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
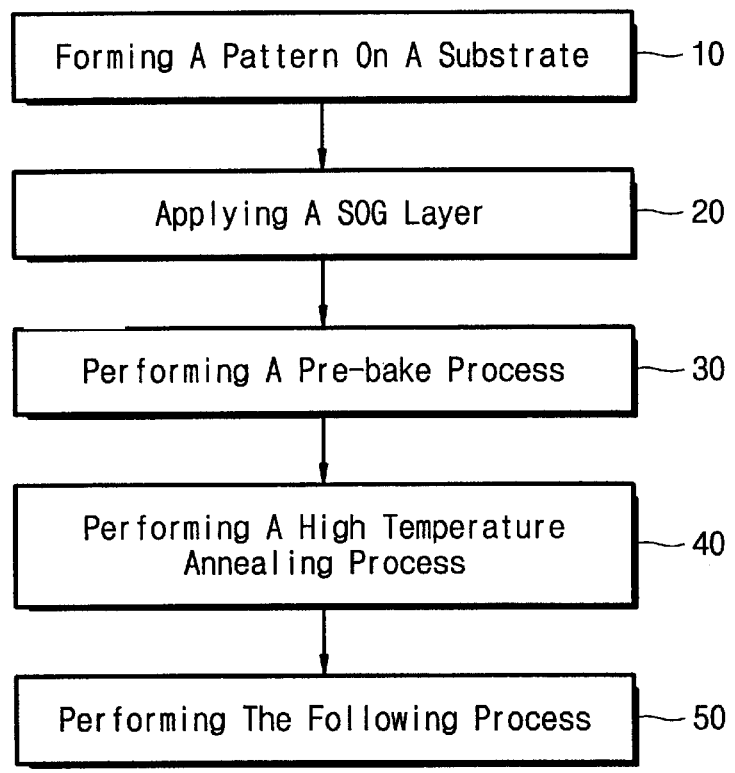
FIG. 1 is a flow chart of a conventional method of forming a SOG insulation layer of a semiconductor device.
Figure 2:
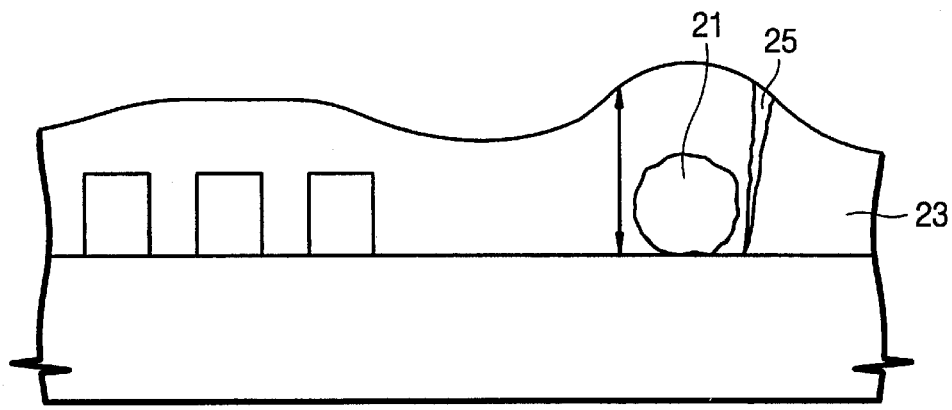
FIG. 2 is a cross-sectional view showing a problem of the conventional method of forming the SOG insulation layer of the semiconductor device.
Figure 3:
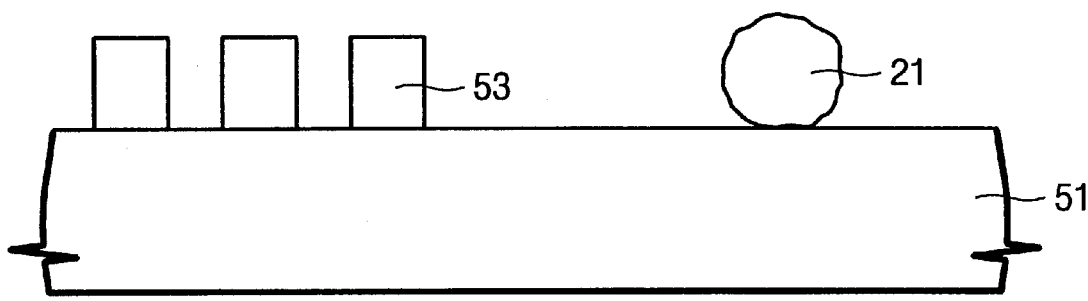
FIG. 3 to FIG. 6 are schematic cross-sectional diagrams showing the process steps of a method of forming a SOG insulation layer of a semiconductor device in accordance with an embodiment of the present invention.

Referring to FIG. 3, first a conductive pattern 53 is formed on a surface of a substrate 51. Each of narrow and deep gaps or spaces formed in the conductive pattern 53 has an aspect ratio, i.e., the ratio of its depth to its width, of more than 5. In the gaps of the conductive pattern 53, trenches for isolation can be formed. Also, the conductive pattern 53 can form gate lines or bit lines for DRAM.

Figure 4:
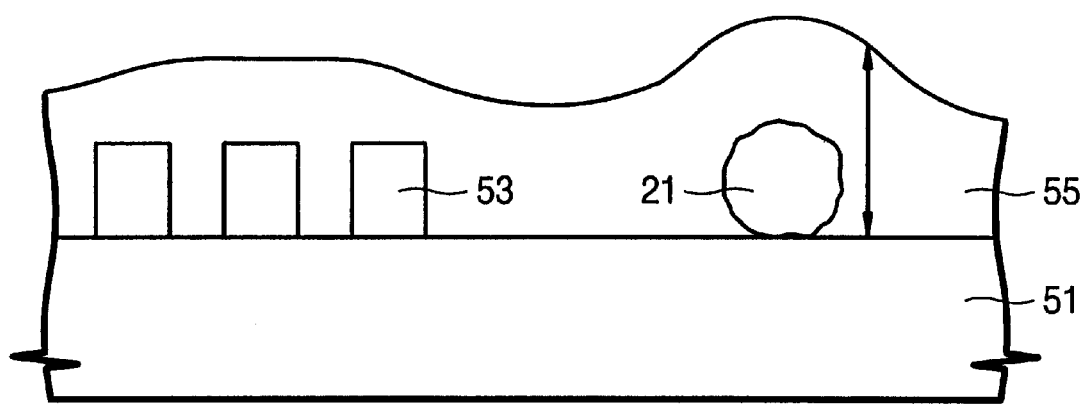

Referring to FIG. 4, a polysilazane, for example a perhydropolysilazane, is applied on the whole surface of the substrate 51 having the conductive pattern 53 to form a SOG insulation layer 55, by means of a spin-coating method. The SOG insulation layer 55 fills the gaps of the conductive pattern 53. The perhydro-polysilazane which is generally indicated as a structural formula —(SiH$_2$NH)n— is used as a solution melted as much as 20 to 24% by weight in a solvent such as dibuthyl ether or xylene. The SOG layer 55 is formed to a thickness of several thousand angstroms A on the conductive pattern 53. Before applying the polysilazane, a silicon oxide layer or a silicon nitride layer can be formed as a buffer layer, by means of a HDP CVD suitable to fill gaps. The buffer layer can act to increase the adhesion between the SOG layer and the substrate on which the conductive pattern is formed.

Then, a pre-bake process for removing solvent ingredients in the SOG layer 55 is carried out to the substrate 51 over which the SOG layer 55 is formed. In the pre-bake process, the substrate 51 is heated in a manner of increasing a heating temperature step by step in a same heating furnace or apparatus. For example, the substrate 51 is heated at temperatures of 75° C., 150° C., 250° C. for several minutes, for example 1 to 2 minutes, respectively. Through the pre-bake process, the solvent ingredients are almost removed. Of course, the heating temperature and time can be adjusted according to the conditions.

Next, a hard bake process which heats the substrate 51 at a temperature of 400 to 450° C. for 30 to 60 minutes is carried out. The hard bake process is performed under an oxidative atmosphere in which oxygen and watery vapor are supplied. As a result, ingredients including silane gas, nitrogen, hydrogen, and the like are discharged in the form of gases from the SOG layer 55. However, in this step, since the process temperature is lower than a general curing temperature of 600° C., an amount of discharged gases is small. Also, since a concentration of discharged gases is low, a chemical reaction which forms particles is reduced. Therefore, a large amount of gases are discharged, but most discharged gases are discharged outside without forming the particles.

Also, since under the oxidative atmosphere, a surface of the SOG layer 55 is partially cured to increase a resistance to diffusion, it becomes difficult to discharge the ingredients in the SOG layer 55 as well as to diffuse outside oxygen into the SOG layer 55.

Also, the hard bake process can be carried out under a vacuum or nitrogen atmosphere as well as an oxidative atmosphere which is abundant in oxygen or watery vapor. In the vacuum or inert gas atmosphere, even though gases are generated from the SOG layer, a chemical reaction forming particles is not activated.

Figure 5:
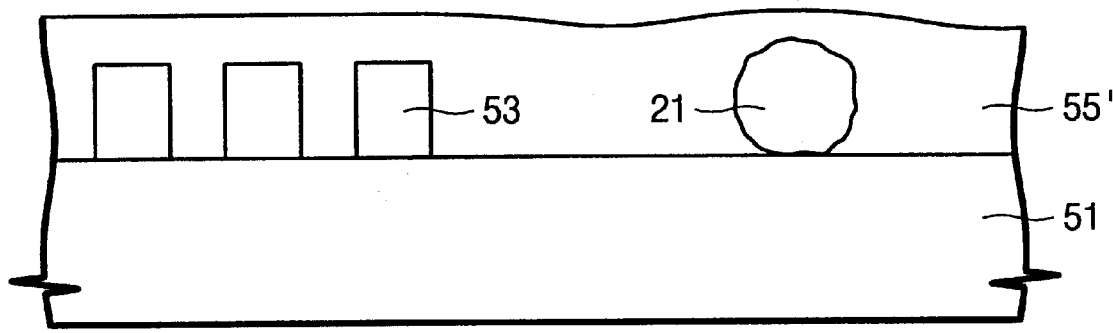

Referring to FIG. 5, a planarization process is carried out to the whole surface of the substrate on which the hard bake process is performed. Consequently, a thickness of the SOG layer 55' is reduced. The planarization process is generally carried out by means of a CMP, after all heat treatments for the SOG layer are finished and then a HDP CVD layer is formed on the SOG layer. However, in the present invention, before carrying out a high temperature annealing, the planarization process is carried out by means of the CMP to remove thickened or projected portions on the SOG layer 55, so that cracks can be prevented from generating due to particles, for example, a particle 21 which exists in the substrate 51 before forming the SOG layer 55. Since a maximum thickness of the SOG layer that the cracks do not occur is generally about 1.5 µm, a thickness of the SOG layer to be removed by means of the CMP is determined in consideration of this. In the CMP, slurries can use basic slurries including at least one selected from silica (SiO$_2$), ceria (CsO$_2$), alumina (Al$_2$O$_3$), and mangania (Mn$_2$O$_3$).

Alternatively, the CMP can be replaced by an anisotropical dry etching or wet etching. The etching as well as the CMP acts to remove the SOG layer 55 all over so as to prevent the cracks from generating, as in an etch back. Also, since an etching amount is increased at the thickened portion of the SOG layer 55, a thickness of the thickened portion easy to generate the cracks is greatly reduced. When the thickness of the SOG layer 55 is reduced, an absolute amount of discharged gases is reduced.

In case an isolation layer is formed on the substrate on which trenches for isolation is formed, the planarization process is to be carried out until the surface of the substrate is exposed.

Figure 6:
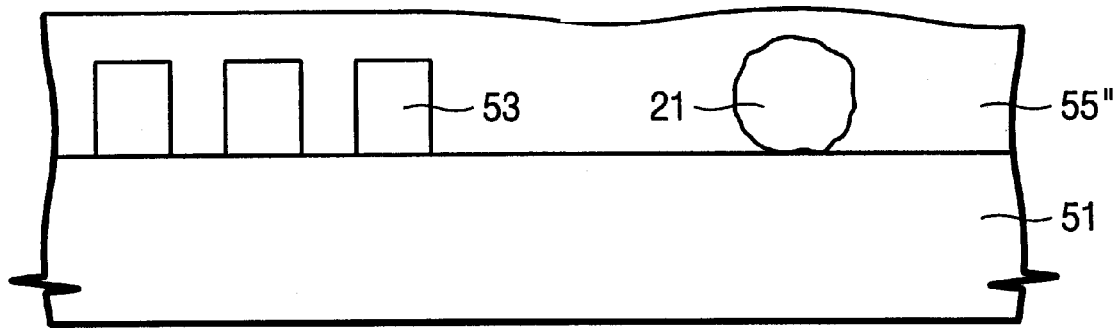

Referring to FIG. 6, after performing the planarization process, the substrate 51 is annealed at a temperature of 700 to 900° C. As a result, the properties of the SOG layer 55" are changed. The annealing which acts mainly to cure the substrate is carried out under an oxidative atmosphere as in the hard bake process, for approximately 10 minutes, for example. Alternatively, to increase the curing effect, the annealing can be carried out for 30 to 60 minutes. Since a large amount of discharged ingredients are already removed through the hard bake process and silicon oxides formed on the surface of the SOG layer 55" through the curing act to restrain gases from discharging, the concentration of discharged gases is lowered and particles generated as the result of reaction between the discharged gases and the supplying gases is also reduced, as compared with annealing at a high temperature without the hard bake process.

When the conductive pattern 53 formed on the substrate forms the gate lines or the bit lines, the following process of forming an insulation layer such as a silicon oxide layer, a silicon nitride layer or a silicon nitride-oxide layer for supplementing the SOG layer 55" can be carried out by means of a method such as HDP CVD, plasma enhanced (PE) CVD, or low pressure (LP) CVD. A planarization process after forming the insulation layer can be omitted since it is previously performed.

As apparent from the foregoing description, it can be appreciated that when the SOG layer is formed as the insulation layer on the substrate having the dense pattern, the present invention can restrain the particles from being generated due to the gases generated from the SOG layer, and prevent cracks from generating after the high temperature annealing due to the particles which exist in the substrate before forming the SOG layer, thereby reducing devices of inferior quality and increasing reliability and stability of the devices.

In the drawings and specification, there has been disclosed a typical preferred embodiment of the invention and, although specific terms are employed, they are used in a generic and descriptive sense only and not for purpose of limitation, the scope of the invention being set forth in the following claims.

What is claimed is:

1. A method of forming a SOG insulation layer of a semiconductor device comprising:

forming said SOG insulation layer on a substrate having a stepped pattern using a polysilazane in a solution state;

performing a pre-bake process for removing solvent ingredients in said insulation layer at a temperature of 50 to 350° C.;

performing a hard bake process for restraining particles from forming, the hard bake process being performed at a temperature of 350 to 500° C.;

annealing at a temperature of 600 to 1200° C.; and planarizing said insulation layer between said hard bake process step and said annealing step.

2. The method according to claim 1, wherein said pre-bake process comprises increasing a temperature continuously for 2 to 7 minutes.

3. The method according to claim 1, wherein said pre-bake process step comprises heating at temperatures of 75° C., 150° C., and 250° C. for 1 to 5 minutes each, by means of an in-situ method.

4. The method according to claim 1, wherein said hard bake process step is carried out at a temperature of 400 to 450° C. for 30 to 60 minutes under an oxidative atmosphere.

5. The method according to claim 1, wherein said hard bake process step is carried out under one of an inert gas and a vacuum atmosphere.

6. The method according to claim 1, wherein said annealing step is carried out at a temperature of 700 to 900° C. for 30 to 120 minutes.

7. A method of forming a SOG insulation layer of a semiconductor device comprising the steps of:

forming said SOG insulation layer on a substrate having a stepped pattern using a polysilazane;

performing a bake process for removing solvent elements of said insulation layer at a temperature of below 500° C.;

planarizing said insulation layer after said bake process step; and annealing said insulation layer at a temperature of 600 to 1200° C. after said planarizing step.

8. The method according to claim 7, wherein said planarizing step is carried out by means of CMP.

9. The method according to claim 8, wherein slurries for said CMP are basic slurries including at least one selected from silica ($SiO_2$), ceria ($CsO_2$), alumina ($Al_2O_3$), and mangania ($Mn_2O_3$).

10. The method according to claim 7, wherein said planarizing step comprises performing at least one of a wet-etching and a dry-etching process to the surface of said substrate.

11. The method according to claim 7, wherein said substrate has at least one trench for isolation formed thereon to define at least one active region, and said planarizing step is carried out until said active region is exposed.

* * * * *